US012683595B2

(12) United States Patent
Hu et al.

(10) Patent No.: US 12,683,595 B2
(45) Date of Patent: Jul. 14, 2026

(54) INVERTER CONTROL METHOD, APPARATUS AND DEVICE

(71) Applicant: Vertiv Corporation, Westerville, OH (US)

(72) Inventors: Huawei Hu, Shenzhen (CN); Peng Chen, Shenzhen (CN)

(73) Assignee: VERTIV CORPORATION, Westerville, OH (US)

( * ) Notice: Subject to any disclaimer, the term of this patent is extended or adjusted under 35 U.S.C. 154(b) by 369 days.

(21) Appl. No.: 18/466,414

(22) Filed: Sep. 13, 2023

(65) Prior Publication Data

US 2024/0088882 A1 Mar. 14, 2024

(30) Foreign Application Priority Data

Sep. 14, 2022 (CN) .......................... 202211132534.0

(51) Int. Cl.
| | |
|---|---|
| *H02M 1/32* | (2007.01) |
| *H02M 1/00* | (2007.01) |
| *H02M 7/487* | (2007.01) |
| *H02M 7/537* | (2006.01) |
| *H03K 17/08* | (2006.01) |

(52) U.S. Cl.
CPC ............ *H03K 17/08* (2013.01); *H02M 7/537* (2013.01)

(58) Field of Classification Search
CPC ........ H02M 7/487; H02M 7/537; H02M 1/32; H02M 1/0025; H03K 17/08
See application file for complete search history.

(56) References Cited

U.S. PATENT DOCUMENTS

2012/0181999 A1 7/2012 Weng

FOREIGN PATENT DOCUMENTS

| | | | | | |
|---|---|---|---|---|---|
| CN | 103117669 | B | * | 12/2014 | |
| CN | 104767368 | A | * | 7/2015 | ............ H02M 7/483 |
| CN | 115489324 | A | * | 12/2022 | ............ B63H 21/17 |
| EP | 3958452 | A1 | | 2/2022 | |

OTHER PUBLICATIONS

Extended European Search Report regarding Application No. 23196118. 6, dated Feb. 5, 2024.

(Continued)

*Primary Examiner* — Sisay G Tiku
(74) *Attorney, Agent, or Firm* — Harness, Dickey & Pierce, P.L.C.

(57) ABSTRACT

An inverter control method, apparatus and device are provided, so as to solve the problem of risk of damage to switching devices in an inverter due to delays. The method includes: in a first switching period, determining a current change duration based on a time instant at which an inductor current in an inverter is equal to a first current threshold and a time instant at which the inductor current is equal to a second current threshold; determining a current change rate based on the current change duration, the first current threshold, and the second current threshold; reducing the first current threshold and the second current threshold if the current change rate is greater than a preset threshold; and controlling a switch by using the reduced current thresholds in a second switching period.

20 Claims, 6 Drawing Sheets

(56) References Cited

OTHER PUBLICATIONS

Gunter Sandro et al.: "Switching time prediction for digital hysteresis control for high frequency current in grid impedance measurement application", 2014 16th European Conference on Power Electronics and Applications, IEEE, Aug. 26, 2014 (Aug. 26, 2014), pp. 1-8, XP032651265, DOI: 10.1109/EPE.2014.6910905.

Shweta Gautam et al.: "Generalized hysteresis current controller for three-level inverter topologies", Industrial Electronics (ISIE), 2012 IEEE International Symposium On, IEEE, May 28, 2012 (2012-05-28), pp. 1393-1398, XP032199915, DOI: 10.1109/ISIE.2012.6237294.

* cited by examiner

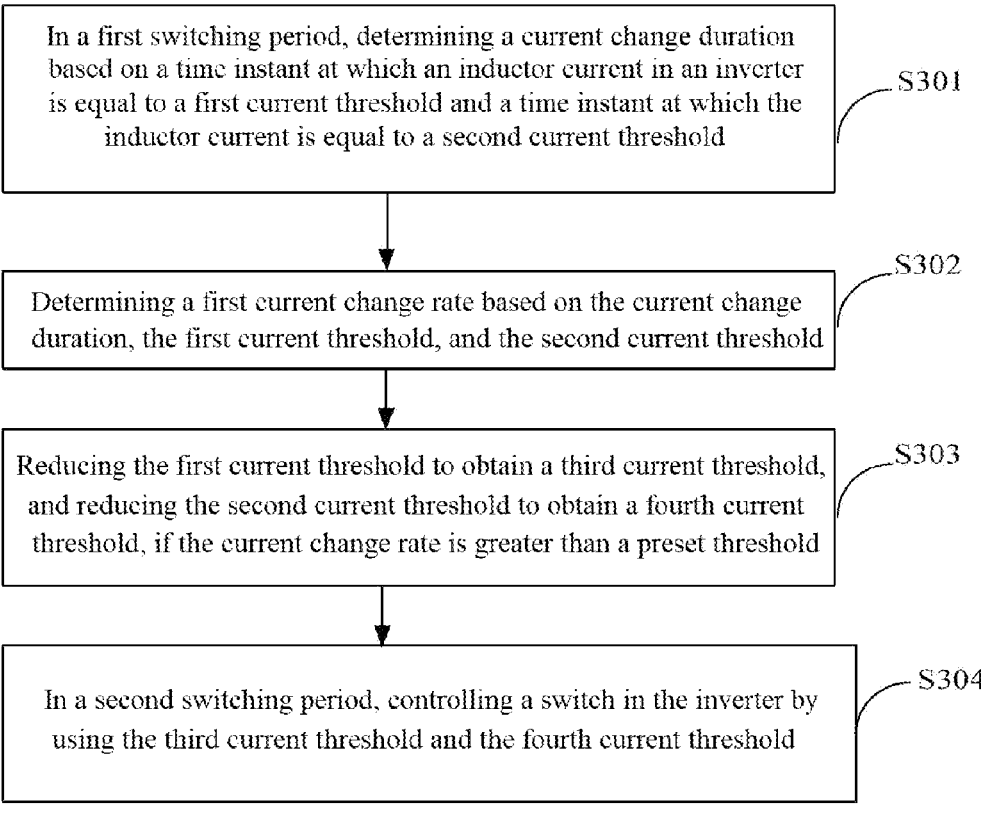

In a first switching period, determining a current change duration based on a time instant at which an inductor current in an inverter is equal to a first current threshold and a time instant at which the inductor current is equal to a second current threshold — S301

Determining a first current change rate based on the current change duration, the first current threshold, and the second current threshold — S302

Reducing the first current threshold to obtain a third current threshold, and reducing the second current threshold to obtain a fourth current threshold, if the current change rate is greater than a preset threshold — S303

In a second switching period, controlling a switch in the inverter by using the third current threshold and the fourth current threshold — S304

Figure 3

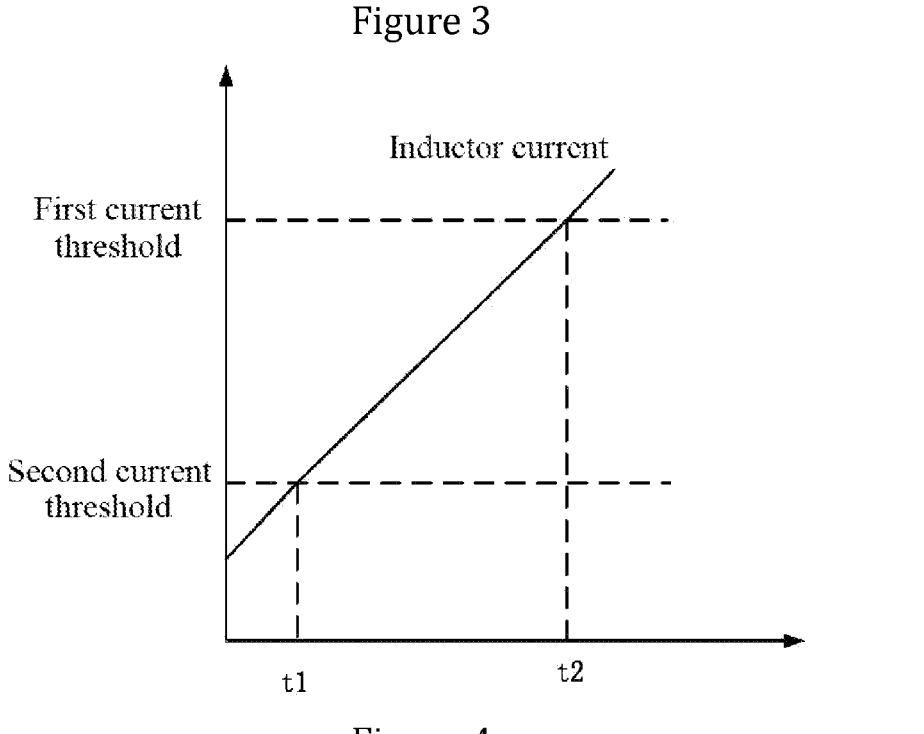

Program product

INVERTER CONTROL METHOD, APPARATUS AND DEVICE

The present application claims priority to Chinese Patent Application No. 202211132534.0, titled "INVERTER CONTROL METHOD, APPARATUS AND DEVICE", filed on Sep. 14, 2022, with the China National Intellectual Property Administration, which is incorporated herein by reference in its entirety.

FIELD

The present disclosure relates to the technical field of inverters, and in particular to an inverter control method, apparatus and device.

BACKGROUND

Current limiting is an important protection technology for an inverter, which effectively protects switching devices by limiting the output current in the case of a large overload, a sudden load or output short circuit, and improves the reliability and safety of the inverter.

Currently, the output current is generally limited by setting a current threshold as a current limiting point. When the inductor current exceeds the current threshold, the switching devices are blocked in a certain order, and when the inductor current drops below the current threshold, the switching devices are released and operate normally.

The switching devices are blocked and released in a certain order. Taking a typical I-type three-level circuit as an example, an outer switch is blocked first, and then an inner switch is blocked after the outer switch is reliably blocked. In this case, two current thresholds are respectively used as current limiting points of the outer switch and the inner switch, and the current threshold as the current limiting point for the outer switch is lower than the current threshold as the current limiting point of the inner switch.

When blocking the switching device, due to hardware processing delay, software processing delay, delay caused by switching device actions and delay caused by the inner switch waiting for the outer switch to be reliably blocked, the current of the switching device at the actual blocking time after the delay may exceed the theoretical current threshold, which may cause damage to the switching device.

SUMMARY

An inverter control method, an inverter control apparatus and a device are provided according to the present disclosure, so as to solve the problem in the conventional technology of the risk of damage to switching devices in the inverter due to delay.

In a first aspect, an inverter control method is provided according to an embodiment of the present disclosure. The method includes:

in a first switching period, determining a current change duration based on a time instant at which an inductor current in an inverter is equal to a first current threshold and a time instant at which the inductor current is equal to a second current threshold;

determining a current change rate based on the current change duration, the first current threshold, and the second current threshold;

reducing the first current threshold to obtain a third current threshold, and reducing the second current threshold to obtain a fourth current threshold, if the current change rate is greater than a preset threshold; and in a second switching period, controlling a switch in the inverter by using the third current threshold and the fourth current threshold, wherein the first current threshold is less than the second current threshold, and the first switching period is earlier than the second switching period.

In a possible implementation, the method further includes, in the first switching period:

controlling a first switch corresponding to the first current threshold to be turned off when the inductor current is equal to the first current threshold; and controlling a second switch corresponding to the second current threshold to be turned off when the inductor current is equal to the second current threshold.

In a possible implementation, in the second switching period, the controlling of the switch in the inverter by using the third current threshold and the fourth current threshold includes:

controlling the first switch corresponding to the first current threshold to be turned off when the inductor current is equal to the third current threshold; and controlling the second switch corresponding to the second current threshold to be turned off when the inductor current is equal to the fourth current threshold.

In a possible implementation, after the controlling of the switch in the inverter by using the third current threshold and the fourth current threshold in the second switching period, the method further includes:

in a third switching period, increasing the third current threshold to obtain a fifth current threshold, and increasing the fourth current threshold to obtain a sixth current threshold, if the current change rate is less than or equal to the preset threshold; and in a fourth switching period, controlling the switch in the inverter by using the fifth current threshold and the sixth current threshold, wherein the second switching period is earlier than the third switching period, the third switching period is earlier than the fourth switching period, and the fifth current threshold is less than the sixth current threshold.

In a possible implementation, in the third switching period, the increasing of the third current threshold to obtain a fifth current threshold, and the increasing of the fourth current threshold to obtain a sixth current threshold, if the current change rate is less than or equal to the preset threshold includes:

in the third switching period, increasing the third current threshold after a preset time period to obtain the fifth current threshold, and increasing the fourth current threshold after the preset time period to obtain the sixth current threshold, if the current change rate is less than or equal to the preset threshold.

In a possible implementation, the method further includes, in the third switching period:

controlling the first switch corresponding to the first current threshold to be turned off when the inductor current is equal to the third current threshold; and controlling the second switch corresponding to the second current threshold to be turned off when the inductor current is equal to the fourth current threshold.

In a possible implementation, the second current threshold is less than the inductor current of the inverter when the inverter is short-circuited.

In a second aspect, an inverter control apparatus is provided according to an embodiment of the present disclosure. The apparatus includes:

a first determination module configured to, in a first switching period, determine a current change duration based on a time instant at which an inductor current in an inverter is equal to a first current threshold and a time instant at which the inductor current is equal to a second current threshold;

a second determination module configured to determine a current change rate based on the current change duration, the first current threshold, and the second current threshold;

an adjustment module configured to reduce the first current threshold to obtain a third current threshold, and reduce the second current threshold to obtain a fourth current threshold, if the current change rate is greater than a preset threshold;

a control module configured to, in a second switching period, control a switch in the inverter by using the third current threshold and the fourth current threshold, wherein the first current threshold is less than the second current threshold, and the first switching period is earlier than the second switching period.

In a possible implementation, the control module is further configured to, in the first switching period:

control a first switch corresponding to the first current threshold to be turned off when the inductor current is equal to the first current threshold; and control a second switch corresponding to the second current threshold to be turned off when the inductor current is equal to the second current threshold.

In a possible implementation, the control module is configured to:

control the first switch corresponding to the first current threshold to be turned off when the inductor current is equal to the third current threshold; and control the second switch corresponding to the second current threshold to be turned off when the inductor current is equal to the fourth current threshold.

In a possible implementation, the adjustment module is further configured to, after controlling the switch in the inverter by using the third current threshold and the fourth current threshold in the second switching period:

in a third switching period, increase the third current threshold to obtain a fifth current threshold, and increase the fourth current threshold to obtain a sixth current threshold, if the current change rate is less than or equal to the preset threshold; and in a fourth switching period, control the switch in the inverter using the fifth current threshold and the sixth current threshold, wherein the second switching period is earlier than the third switching period, the third switching period is earlier than the fourth switching period, and the fifth current threshold is less than the sixth current threshold.

In a possible implementation, the adjustment module is configured to:

in the third switching period, increase the third current threshold after a preset time period to obtain the fifth current threshold, and increase the fourth current threshold after the preset time period to obtain the sixth current threshold, if the current change rate is less than or equal to the preset threshold.

In a possible implementation, the control module is further configured to, in the third switching period:

control a first switch corresponding to the first current threshold to be turned off when the inductor current is equal to the third current threshold; and control a second switch corresponding to the second current threshold to be turned off when the inductor current is equal to the fourth current threshold.

In a possible implementation, the second current threshold is less than the inductor current of the inverter when the inverter is short-circuited.

In a third aspect, an inverter control device is provided according to an embodiment of the present disclosure. The device includes a memory and a processor, the memory stores a computer program, and the processor implements steps of the inverter control method according to any one of the implementations of the above first aspect when executing the computer program.

In a fourth aspect, a computer storage medium is provided according to an embodiment of the present disclosure. The computer storage medium stores computer instructions, where the computer instructions, when run on a computer, causes the computer to execute steps of the inverter control method according to any one of the implementations of the above first aspect.

The following beneficial effects are provided.

With the inverter control method, apparatus and device according to the embodiments of the present disclosure, in a first switching period, a current change duration is determined based on a time instant at which an inductor current in an inverter is equal to a first current threshold and a time instant at which the inductor current is equal to a second current threshold; a current change rate is determined based on the current change duration, the first current threshold, and the second current threshold; the first current threshold and the second current threshold are reduced if the current change rate is greater than a preset threshold; and a switch in the inverter is controlled by using the two reduced current thresholds in a second switching period. The first current threshold is less than the second current threshold, and the first switching period is earlier than the second switching period. The current change rate being greater than the preset threshold indicates that the current rises rapidly. In order to protect the switch and the inverter, the current thresholds are reduced, and the switch in the inverter are controlled by using the two reduced current thresholds in a next switching period. In the case where the current rises rapidly, the risk of damage to the switch can be reduced by using a reduced current threshold to control the switch, thereby reducing the risk of damage to the inverter, and improving the reliability of the inverter.

BRIEF DESCRIPTION OF THE DRAWINGS

In order to clearly illustrate technical solutions in the embodiments of the present disclosure, the accompanying drawings used in the description of the embodiments is briefly described below. It is apparent that the accompanying drawings in the following description are only for some of the embodiments of the present disclosure. For those skilled in the art, other drawings can be obtained based on the provided accompanying drawings without creative efforts.

FIG. 3 is a schematic flowchart of an inverter control method according to an embodiment of the present disclosure;

FIG. 4 is a schematic diagram showing a waveform of an increasing inductor current according to an embodiment of the present disclosure;

DETAILED DESCRIPTION OF EMBODIMENTS

In order to make the object, technical solution and advantages of the present disclosure clearer, the present disclosure will be further described in detail below in conjunction with the accompanying drawings. Obviously, the described embodiments are only some rather than all embodiments of the present disclosure. Based on the embodiments of the present disclosure, all other embodiments obtained by a person of ordinary skill in the art without making creative efforts fall within the protection scope of the present disclosure.

Figure 1:
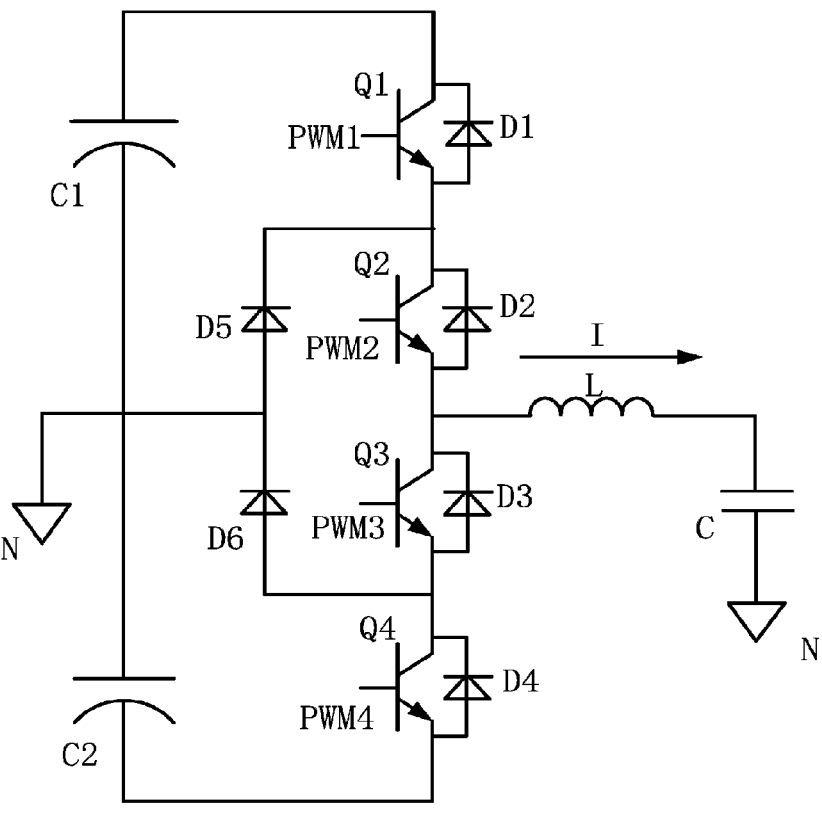
FIG. 1 is a schematic structural diagram of a type I three-level inverter according to the conventional technology.

FIG. 1 is a schematic structural diagram of an I-type three-level inverter according to the conventional technology. When performing current limiting protection on the inverter, the outer switches (Q1 and Q4) are blocked first, and the inner switches (Q2 and Q3) are blocked after the outer switches are reliably blocked. In this case, two current thresholds are required to be set as current limiting points for the inner switches and the outer switches respectively, and the current threshold as the current limiting point for the outer switches is lower than the current threshold as the current limiting point for the inner switches.

Figure 2:
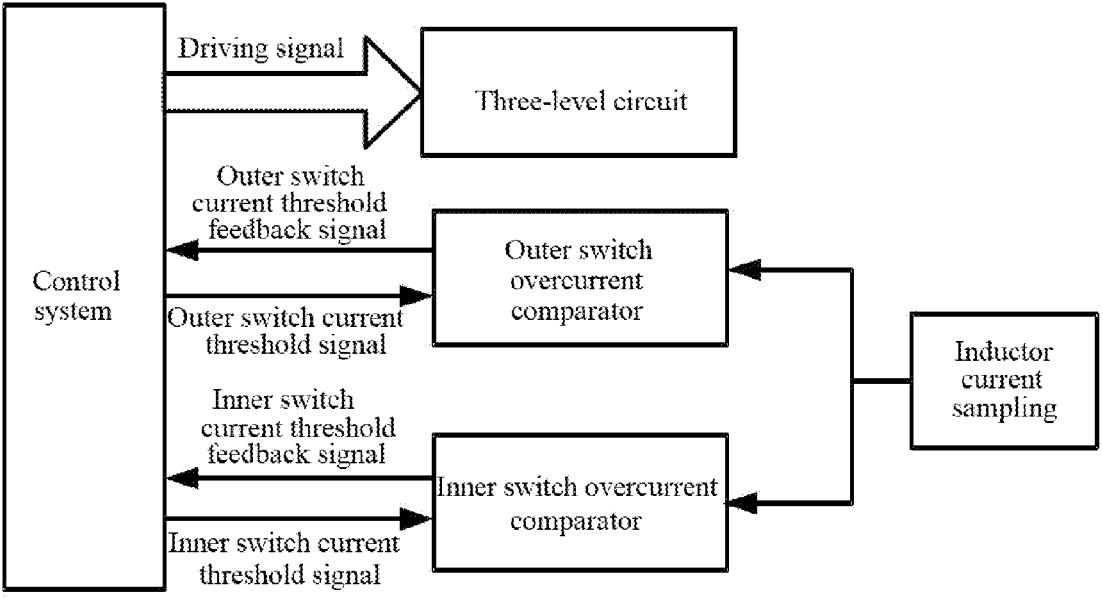
FIG. 2 is a schematic diagram showing an inverter control process according to the conventional technology.

The current limiting function of the I-type three-level inverter as shown in FIG. 1 is usually realized by the software of the control system. As shown in FIG. 2, the control system outputs an outer switch current threshold and an inner switch current threshold, which are compared with a sampling value of the inductor current by using a comparator in the control chip or an external comparator. In a case that the sampling value of the inductor current exceeds or falls below the current threshold, a different signal is fed back to the control system, and the control system blocks (turn off) or unblock (turn on) the inner switch or the outer switch of the I-type three-level inverter according to a logic of a program. The current threshold is outputted by the control system software. In addition, the control system outputs a driving signal to drive the three-level circuit to operate.

The inductor current outputted by the inverter rises and falls approximately in a straight line within a switching period. When the inductor current rises rapidly, due to delay of the blockage of the switching device, such as hardware delay, software delay, delay caused by switch tube action, and delay caused by the inner switches waiting for the outer switches to be reliably blocked, the inductor current may continuously increases and exceeds the outer switch current threshold or the inner switch current threshold, and then the switching devices are blocked. Therefore, the inductor current when the switch is actually blocked may exceed the current threshold, which may damage the switches and the inverter.

In addition, for different types of overloads, the current rises at different rates. The current when the switch is actually blocked after the delay may exceed the current threshold to different degrees. Especially for a short-circuit operation condition, the current rises the fastest, and the current when the switch is actually blocked is greater, which causes a greater risk of damage to the switches and the inverter.

Based on the above problem, an inverter control method is provided according to an embodiment of the present disclosure. As shown in FIG. 3, the method includes the following steps S301 to S304.

In step S301, in a first switching period, a current change duration is determined based on a time instant at which an inductor current in an inverter is equal to a first current threshold and a time instant at which the inductor current is equal to a second current threshold.

In step S302, a current change rate is determined based on the current change duration, the first current threshold, and the second current threshold.

In step S303, the first current threshold is reduced to obtain a third current threshold, and second current threshold is reduced to obtain a fourth current threshold, if the current change rate is greater than a preset threshold.

In step S304, in a second switching period, a switch in the inverter is controlled by using the third current threshold and the fourth current threshold.

The first current threshold is less than the second current threshold, and the first switching period is earlier than the second switching period.

In the embodiment of the present disclosure, in a first switching period, a current change duration is determined based on a time instant at which an inductor current in an inverter is equal to a first current threshold and a time instant at which the inductor current is equal to a second current threshold; a current change rate is determined based on the current change duration, the first current threshold, and the second current threshold; the first current threshold and the second current threshold are reduced if the current change rate is greater than a preset threshold; and a switch in the inverter is controlled by using the two reduced current thresholds in a second switching period. The first current threshold is less than the second current threshold, and the first switching period is earlier than the second switching period. The current change rate being greater than the preset threshold indicates that the current rises rapidly. In order to protect the switch and the inverter, the current thresholds are reduced, and the switch in the inverter is controlled by using the two reduced current thresholds in a next switching period. In the case where the current rises rapidly, the risk of damage to the switch can be reduced by using a reduced current threshold to control the switch, thereby reducing the risk of damage to the inverter, and improving the reliability of the inverter.

The inverter control method according to the embodiment of the present disclosure is applicable to any inverter with two or more different current thresholds, for example, the above I-type three-level inverter, and a T-type three-level inverter.

In an implementation, the first current threshold and the second current threshold may be preset. In order to ensure that the switch is not damaged, a maximum inductor current allowed by the switch may be determined under a short-circuit operation condition, and the maximum inductor current may be used as the second current threshold. A current smaller than the second current threshold may be determined as the first current threshold. A difference between the second current threshold and the first current threshold may be determined according to actual conditions, and is not limited in the embodiments of the present disclosure.

In the first switching period, after the switch in the inverter is turned on, the inductor current rises rapidly, and a time period between the time instant at which the inductor current is equal to the first current threshold and the time instant at which the inductor current is equal to the second current threshold is used as the current change duration, which may be determined by the following manners.

In a first manner, in the first switching period, when the inductor current is equal to the first current threshold, the control system software starts a timer, and when the inductor current is equal to the second current threshold, the control system software stops the timer, and uses the timing duration of the timer as the current change duration.

For example, as shown in FIG. 4, the timer starts timing at a time instant t1, and stops timing at a time instant t2, and the timing duration is determined as the current change duration.

In a second manner, in the first switching period, the first time instant at which the inductor current in the inverter is equal to the first current threshold is determined, and the second time instant at which the inductor current is equal to the second current threshold is determined, and a duration between the second time instant and the first time instant is determined as the current change duration.

For example, as shown in FIG. 4, at the time instant t1, the inductor current is equal to the first current threshold, and at the time instant t2, the inductor current is equal to the second current threshold, and the duration between t1 and t2 is the current change duration.

After the current change duration is obtained, the current change rate is determined based on the current change duration, the first current threshold, and the second current threshold.

In an embodiment, a difference between the first current threshold and the second current threshold is calculated, and a quotient obtained by dividing the obtained difference by the current change duration is determined as the current change rate.

For example, as shown in FIG. 4, the current change rate is equal to (i2−i1)/(t2−t1).

In the embodiment of the present disclosure, the current change rate characterizes a rate at which the current rises, and the calculated current change rate is compared with the preset threshold. The current change rate being greater than the preset threshold indicates that the current rises rapidly, and the inverter is short-circuited. Based on determination that the inverter is short-circuited, both the first current threshold and the second current threshold are reduced to obtain the third current threshold and the fourth current threshold, in order to protect the switch.

In an implementation, a current rising rate under a normal operation condition and a current rising rate under a short-circuit operation condition are determined, and a value higher than the current rising rate under the normal operation condition and lower than the current rising rate under the short-circuit operation condition is determined as the preset threshold. The current rising rate under the normal operation condition and the current rising rate under the short-circuit operation condition may be measured in applications.

The short-circuit operation condition may be determined by using the following equation:

$$U_{dc} - U_{out} = \frac{i_2 - i_1}{t_2 - t_1} L,$$

wherein $U_{dc}$ is a DC bus voltage, $U_{out}$ is an output voltage, L is an inductance of an inductor, $i_2$ is the second current threshold, $i_1$ is the first current threshold, $t_2$ is the time instant at which the inductor current is equal to the second current threshold, and $t_1$ is the time instant at which the inductor current is equal to the first current threshold.

$U_{dc}$, L, $i_2$, $i_1$, $t_2$, and $t_1$ are known, and $U_{out}$ may be calculated by using the above equation. The calculated $U_{out}$ approaching zero indicates that the inverter is short-circuited.

In the second switching period, that is, the next switching period after the time instant when the inverter is short-circuited, the switches in the inverter are controlled by using the third current threshold and the fourth current threshold.

In an embodiment, in the second switching period, when the inductor current is equal to the third current threshold, the first switch corresponding to the first current threshold is controlled to be turned off; when the inductor current is equal to the fourth current threshold, the second switch corresponding to the second current threshold is controlled to be turned off, where the fourth current threshold is greater than the third current threshold.

Taking the inverter in FIG. 1 as an example, after it is determined that the inverter is short-circuited, in a next switching period after the inverter is short-circuited, when the inductor current is equal to the third current threshold, the outer switches Q1 and Q4 are controlled to be turned off; and when the inductor current is equal to the fourth current threshold, the inner switches Q2 and Q3 are controlled to be turned off.

In the embodiment of the present disclosure, the two current thresholds are reduced, and the switches in the inverter are controlled by using the two reduced current thresholds, such that damage to the switches due to the rapid rise of the current under the short-circuit operation condition can be reduced, so as to protect the inverter and improve the reliability of the inverter.

The current change rate being less than or equal to the preset threshold indicates that the inverter is not short-circuited, and the first current threshold and the second current threshold are maintained to control the switches in the inverter.

In an embodiment, the second current threshold may be smaller than the maximum inductor current allowable by the switch under the short-circuit operation condition, and in this case, the first current threshold is smaller.

For example, under the short-circuit operation condition, the maximum inductor current allowable by the switch is equal to 100 A, and 100 A may be used as the second current threshold, 80 A may be used as the first current threshold; or a current value less than 100 A, such as 90 A, may be used as the second current threshold, and 70 A may be used as the first current threshold.

By applying two smaller current thresholds, the short-circuit operation condition can be determined before the current reaches the short-circuit current, so as to better protect the switch and the inverter.

It should be noted that the switch corresponding to the first current threshold in the embodiment of the present disclosure is a switch that is turned off first, for example, the outer switch in the I-type three-level inverter, and the switch corresponding to the second current threshold is a switch that is turned off after the switch corresponding to the first current threshold, for example, the inner switch in the I-type three-level inverter. For a two-level inverter, although there is actually only one current limiting point, that is, only one current threshold, the current rising rate may be calculated by setting an additional reference current limiting point (current threshold), so as to determine whether a short circuit occurs.

For the two-level inverter, since the inner switches and the outer switches are not distinguished, the two-level inverter includes only one current threshold, such as a seventh current threshold. If it is determined that a short circuit occurs, the current change duration is determined based on a time instant at which the inductor current in the two-level inverter is equal to a preset current threshold and a time instant at which the inductor current is equal to the seventh current threshold, and the current change rate may be determined based on the current change duration, the preset current threshold, and the seventh current threshold. If the current change rate is greater than the preset threshold, the preset current threshold is reduced, and the seventh current threshold is reduced. In the next switching period, the switch in the two-level inverter is controlled by using the current threshold obtained by reducing the seventh current threshold, wherein the preset current threshold is less than the seventh current threshold. The above steps may be repeated in other switching periods.

The idea of the control method for the two-level inverter is the same as that of the control method for the three-level inverter, and for the specific control, reference can be made to the above-mentioned control of the three-level inverter, which will not be repeated.

The switch of the embodiments of the present disclosure may be a semiconductor switching device such as an IGBT, a MOSFET, a SiC MOSFET, or a gallium nitride transistor.

In an embodiment, in the first switching period, when the inductor current is equal to the first current threshold, the first switch corresponding to the first current threshold is controlled to be turned off, and when the inductor current is equal to the second current threshold, the second switch corresponding the second current threshold is controlled to be turned off.

Taking the I-type three-level inverter shown in FIG. 1 as an example, in the first switching period, when the inductor current is equal to the first current threshold, the outer switches Q1 and Q4 are controlled to be turned off, and when the inductor current is equal to the second current threshold, the inner switches Q2 and Q3 are controlled to be turned off.

In the embodiment of the present disclosure, after the first switch is turned off, the second switch is controlled to be turned off, so as to protect the first switch and the second switch. It should be noted that the first switch corresponds to the outer switch in the three-level inverter, and the second switch corresponds to the inner switch of the three-level inverter.

The first switching period is a switching period for determining if the inverter is short-circuited, that is, after determines that the inverter is short-circuited in the first switching period, the first current threshold and the second current threshold are used to control the corresponding switches in the inverter, and the first current threshold and the second current threshold are reduced. In a next switching period, that is, the second switching period, the switches in the inverter are controlled by using the reduced current thresholds.

In the second switching period, the switches in the inverter are controlled by using the third current threshold and the fourth current threshold. In a third switching period after the second switching period, if the current change rate is less than or equal to the preset threshold, the third current threshold is adjusted to the first current threshold, and the fourth current threshold is adjusted to the second current threshold. In a fourth switching period, the switches in the inverter are controlled by using the first current threshold and the second current threshold. The second switching period is earlier than the third switching period, and the third switching period is earlier than the fourth switching period.

In addition, in the third switching period, when the inductor current is equal to the third current threshold, the first switch corresponding to the first current threshold is controlled to be turned off, and when the inductor current is equal to the fourth current threshold, the second switch corresponding to the second current threshold is controlled to be turned off.

In the embodiment of the present disclosure, in the second switching period, when the inductor current is equal to the third current threshold, the switch corresponding to the first current threshold is controlled to be turned off, and when the inductor current is equal to the fourth current threshold, the switch corresponding to the second current threshold is controlled to be turned off. In a switching period subsequent to the second switching period, that is, the third switching period, the third current threshold and the fourth current threshold are used to control the switches in the inverter, that is, when the inductor current is equal to the third current threshold, the switch corresponding to the first current threshold is controlled to be turned off; and when the inductor current is equal to the fourth current threshold, the switch corresponding to the second current threshold is controlled to be turned off. In addition, in the third switching period, a third time instant at which the inductor current is equal to the third current threshold is determined, a fourth time instant at which the inductor current is equal to the fourth current threshold is determined, and a duration between the third time instant and the fourth time instant is used as a second current change duration. A difference between the fourth current threshold and the third current threshold is determined, and a quotient obtained by dividing the difference by the second current change duration is determined as the second current change rate. The second current change rate is compared with the preset threshold. If the second current change rate is greater than the preset threshold, the third current threshold and the fourth current threshold are used to control the switches in a next switching period. If the second current change rate is less than or equal to the preset threshold, which indicates that there is no short circuit, the third current threshold is increased to obtain a fifth current threshold, and the fourth current threshold is increased to obtain a sixth current threshold, and in a switching period subsequent to the third switching period, that is, the fourth switching period, the fifth current threshold and the sixth current threshold are used to control the switches.

It should be noted that the fifth current threshold in the embodiment of the present disclosure may be equal to the first current threshold, or may be smaller than the first current threshold, or may be greater than the first current threshold; and the sixth current threshold may be equal to the second current threshold, or may be smaller than the second current threshold, or may be greater than the second current threshold.

For example, some products have higher requirements for reliability, but low requirements for output capability. If the short circuit disappears after it occurs, the thresholds are not restored to the original thresholds, that is, the first current threshold and the second current threshold, for safety reasons, until the inverter is shut down for maintenance. If the first current threshold and the second current threshold are not restored exactly, but slightly higher or slightly lower values are used, approximately the same effect can also be achieved.

In an embodiment, in the third switching period, if the current change rate is less than or equal to the preset threshold, in a case that the third current threshold is reduced to obtain the fifth current threshold, and the fourth current threshold is reduced to obtain the sixth current threshold, the third current threshold is adjusted to the fifth current threshold after a preset time period, and the fourth current threshold is adjusted to the sixth current threshold after a preset time period.

Short circuit caused by arc discharge due to insufficient insulation distance rather than a direct contact may occurs repeatedly and intermittently. By delaying the restoration of the current threshold by the preset time period, frequent adjustment of the current threshold when the short circuit occurs intermittently and repeatedly, which cannot produce continuous and effective protection for the device, can be avoided.

Due to the fast processing speed of software, the calculation, determination and adjustment can be completed within one switching period, so the short circuit occurs in only the first switching period, (the switching period in which the short circuit occurs), and the switches are blocked according to the original current thresholds (the first current threshold and the second current threshold), and in the subsequent switching period (the second switching period), the switches are blocked according to the reduced current thresholds (the third current threshold and the fourth current threshold), thereby reducing the risk of damage to the switches to a great extent.

If the short-circuit operation condition disappears and the rising rate of the inductor current is lower than or equal to the preset threshold, the software can restore the original current threshold (from the third current threshold to the first current threshold, from the fourth The current threshold to the second current threshold) immediately or after a time period according to the situation, thereby ensuring the maximum output capability of the inverter.

It should be noted that the first switching period in the embodiment of the present disclosure does not refer to the first one of the switching periods. Similarly, the second switching period, the third switching period and the fourth switching period are not associated with the order of switching periods. In the embodiment of the present disclosure, it is only limited that the first switching period is earlier than the second switching period, the second switching period is earlier than the third switching period, and the third switching period is earlier than the fourth switching period.

For example, if a short circuit occurs in the first switching period and lasts for multiple switching periods, the second switching period is a next switching period subsequent to the first switching period, and from the second switching period, the current change rate is determined in each switching period. If the current change rate is less than the preset threshold, the current threshold is increased in the next switching period or the increasing of the current threshold is delayed for several periods (delayed for the preset time period), and the switching period in which current threshold is increased is the third switching period. The next switching period subsequent to the third switching periods is the fourth switching period.

Figure 5:
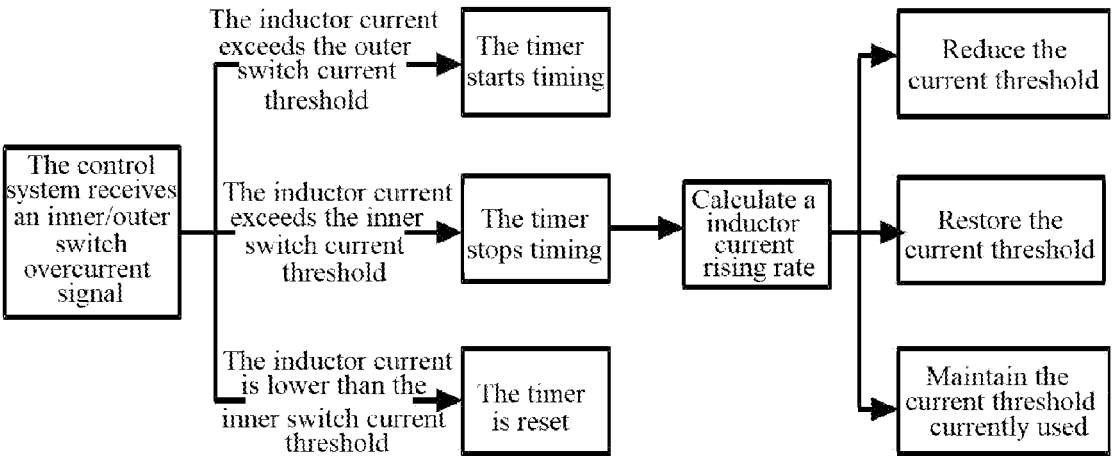
FIG. 5 is a schematic flowchart of a control system dynamically adjusting a current threshold according to an embodiment of the present disclosure.

FIG. 5 is a flowchart of a control system dynamically adjusting a current threshold according to an embodiment of the present disclosure.

Based on the I-type three-level inverter shown in FIG. 1, firstly, the control system receives an overcurrent signal of the inner switches or the outer switches, and when the inductor current exceeds the outer switch current threshold, a timer starts timing; and when the inductor current exceeds the inner switch current threshold, the timer stops timing. The current change rate of the inductor current is calculated based on the timing data from the timer. If the current change rate is greater than the preset threshold, the first current threshold and the second current threshold are reduced to obtain the third current threshold and the fourth current threshold, and the switches are controlled by using the third current threshold and the fourth current threshold. When controlling the switches by using the third current threshold and the fourth current threshold, if the current change rate is less than or equal to the preset threshold, the third current threshold and the fourth current threshold are increased to obtain the fifth current threshold and the sixth current threshold, and the switches are controlled by using the fifth current threshold and the sixth current threshold. If the current change rate is still greater than the preset threshold, the third current threshold and the fourth current threshold are used to control the switches. When controlling the switches by using the first current threshold and the second current threshold, if the current change rate is less than the preset threshold, the first current threshold and the second current threshold are used to control the switches. The timer is reset when the inductor current falls below the inner switches current threshold.

It should be noted that, in the embodiments of the present disclosure, the outer switch current threshold is the first current threshold, and the inner switch current threshold is the second current threshold.

Figure 6:
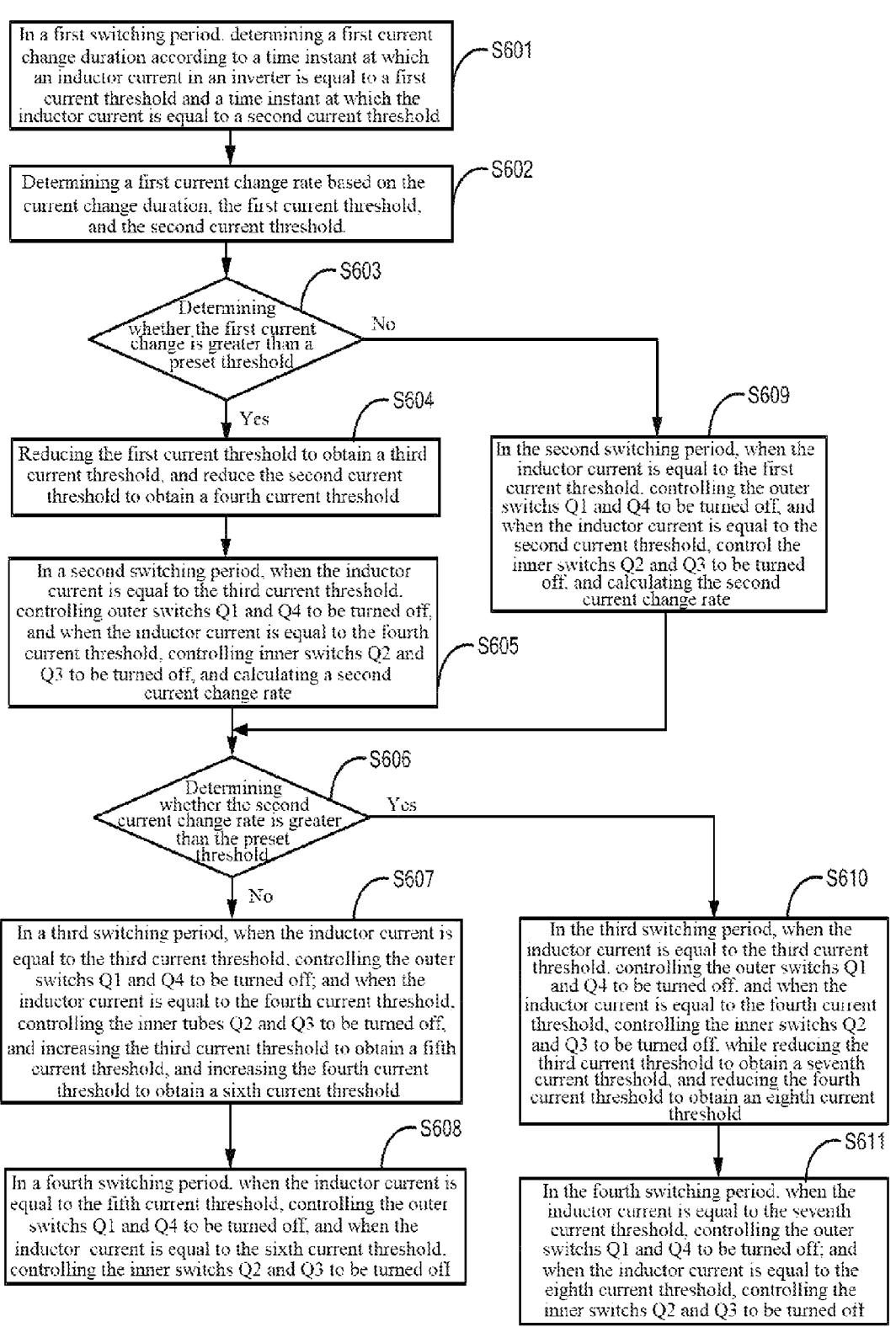
FIG. 6 is a schematic complete flowchart showing an overall process of an inverter control method according to an embodiment of the present disclosure.

FIG. 6 is a flowchart showing an overall process of an inverter control method according to an embodiment of the present disclosure.

In step S601, in a first switching period, a first current change duration is determined according to a time instant at which an inductor current in an inverter is equal to a first current threshold and a time instant at which the inductor current is equal to a second current threshold.

It should be noted that the first current threshold and the second current threshold are preset, and are current limit point reference values before adjustment.

In step S602, a first current change rate is determined based on the current change duration, the first current threshold, and the second current threshold.

In step S603, it is determined whether the first current change is greater than a preset threshold. If the first current change rate is greater than the preset threshold, step S604 is performed; otherwise, step S609 is performed.

In step S604, the first current threshold is reduced to obtain a third current threshold, and the second current threshold is reduced to obtain a fourth current threshold.

The third current threshold and the fourth current threshold are the adjusted current limit point reference values, and the adjustment may be performed by reducing the first current threshold by a first preset value, and reducing the second current threshold by a second preset value, where the first preset value and the second preset value may be the same or different.

In addition, in the first switching period, when the inductor current is equal to the first current threshold, the outer switches Q1 and Q4 are controlled to be turned off, and when the inductor current is equal to the second current threshold, the inner switches Q2 and Q3 are controlled to be turned off.

In step S605, in a second switching period, when the inductor current is equal to the third current threshold, outer switches Q1 and Q4 are controlled to be turned off; and when the inductor current is equal to the fourth current threshold, inner switches Q2 and Q3 are controlled to be turned off, and a second current change rate is calculated.

The second current change rate may be calculated in a same manner as above, which will not be repeated here.

In step S606, it is determined whether the second current change rate is greater than the preset threshold. If the second current change rate is greater than the preset threshold, step S610 is performed; otherwise, step S607 is performed.

In step S607, in a third switching period, when the inductor current is equal to the third current threshold, the outer switches Q1 and Q4 are controlled to be turned off; and when the inductor current is equal to the fourth current threshold, the inner switches Q2 and Q3 are controlled to be turned off, and the third current threshold is increased to obtain a fifth current threshold, and the fourth current threshold is increased to obtain a sixth current threshold.

It should be noted that in S607, alternatively, the third current threshold may be adjusted to the first current threshold, and the fourth current threshold may be adjusted to the second current threshold, which may be determined according to actual conditions in specific implementations.

In step S608, in a fourth switching period, when the inductor current is equal to the fifth current threshold, the outer switches Q1 and Q4 are controlled to be turned off, and when the inductor current is equal to the sixth current threshold, the inner switches Q2 and Q3 are controlled to be turned off.

In step S609, in the second switching period, when the inductor current is equal to the first current threshold, the outer switches Q1 and Q4 are controlled to be turned off, and when the inductor current is equal to the second current threshold, the inner switches Q2 and Q3 are controlled to be turned off. In addition, the second current change rate is calculated, and the procedure proceeds to S606.

In step S610, in the third switching period, when the inductor current is equal to the third current threshold, the outer switches Q1 and Q4 are controlled to be turned off, and when the inductor current is equal to the fourth current threshold, the inner switches Q2 and Q3 are controlled to be turned off In addition, the third current threshold is reduced to obtain a seventh current threshold, and the fourth current threshold is reduced to obtain an eighth current threshold;

In step S611, in the fourth switching period, when the inductor current is equal to the seventh current threshold, the outer switches Q1 and Q4 are controlled to be turned off; and when the inductor current is equal to the eighth current threshold, the inner switches Q2 and Q3 are controlled to be turned off.

Based on the same idea, an inverter control apparatus is provided according to an embodiment of the present disclosure. Since the method according to the embodiments of the present disclosure is applicable to the apparatus, and the principle of solving the problem by the apparatus is similar to the method, for the implementation of the apparatus, reference can be made to the implementation of the method, and the repeated parts will not be described.

Figure 7:
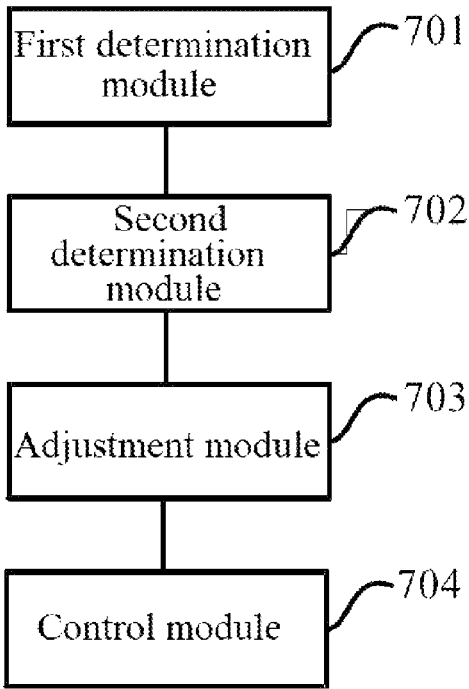
FIG. 7 is a schematic structural diagram of an inverter control apparatus according to an embodiment of the present disclosure.

FIG. 7 is a schematic structural diagram of an inverter control apparatus according to an embodiment of the present disclosure. As shown in FIG. 7, the inverter control apparatus includes a first determination module 701, a second determination module 702, an adjustment module 703, and a control module 704.

The first determination module 701 is configured to, in a first switching period, determine a current change duration based on a time instant at which an inductor current in an inverter is equal to a first current threshold and a time instant at which the inductor current is equal to a second current threshold.

The second determination module 702 is configured to determine a current change rate based on the current change duration, the first current threshold, and the second current threshold.

The adjustment module 703 is configured to reduce the first current threshold to obtain a third current threshold, and reduce the second current threshold to obtain a fourth current threshold, if the current change rate is greater than a preset threshold.

The control module 704 is configured to, in a second switching period, control a switch in the inverter by using the third current threshold and the fourth current threshold.

The first current threshold is less than the second current threshold, and the first switching period is earlier than the second switching period.

In an embodiment, the control module 704 is further configured to, in the first switching period:

control a first switch corresponding to the first current threshold to be turned off when the inductor current is equal to the first current threshold; and control a second switch corresponding to the second current threshold to be turned off when the inductor current is equal to the second current threshold.

In an embodiment, the control module 704 is configured to:

control the first switch corresponding to the first current threshold to be turned off when the inductor current is equal to the third current threshold; and control the second switch corresponding to the second current threshold to be turned off when the inductor current is equal to the fourth current threshold.

In an embodiment, the adjustment module 703 is further configured to, after controlling the switch in the inverter by using the third current threshold and the fourth current threshold in the second switching period:

in a third switching period, increase the third current threshold to obtain a fifth current threshold, and increase the fourth current threshold to obtain a sixth current threshold, if the current change rate is less than or equal to the preset threshold; and in a fourth switching period, control the switch in the inverter using the fifth current threshold and the sixth current threshold, wherein the second switching period is earlier than the third switching period, the third switching period is earlier than the fourth switching period, and the fifth current threshold is less than the sixth current threshold.

In an embodiment, the adjustment module 703 is configured to:

in the third switching period, increase the third current threshold after a preset time period to obtain the fifth current threshold, and increase the fourth current threshold after the preset time period to obtain the sixth current threshold, if the current change rate is less than or equal to the preset threshold.

In an embodiment, the control module 704 is further configured to, in the third switching period:

control a first switch corresponding to the first current threshold to be turned off when the inductor current is equal to the third current threshold; and control a second switch corresponding to the second current threshold to be turned off when the inductor current is equal to the fourth current threshold.

In an embodiment, the second current threshold is less than the inductor current of the inverter when the inverter is short-circuited.

Based on the same idea, an inverter control device is further provided according to an embodiment of the present disclosure. Since the method according to the embodiments of the present disclosure is applicable to the device, and the principle of solving the problem by the device is similar to the method, for the implementation of the device, reference can be made to the implementation of the method, and the repeated parts will not be described.

The inverter control device 80 according to this embodiment of the present disclosure is described below with reference to FIG. 8. The inverter control device 80 shown in FIG. 8 is only an example, and should not bring any limitation to the functions and application scope of the embodiments of the present disclosure.

Figure 8:
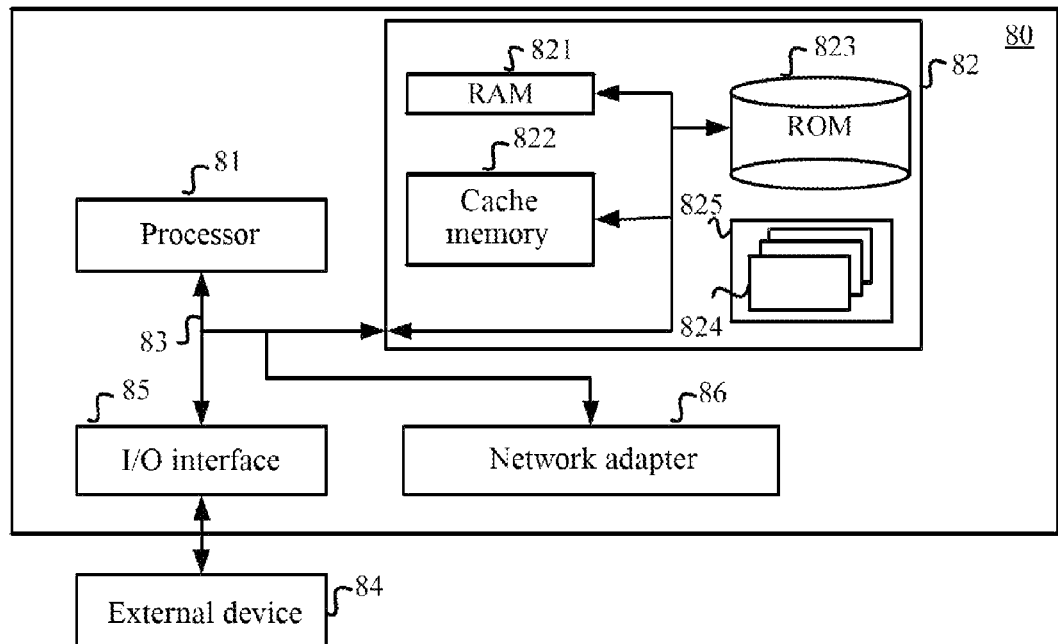
FIG. 8 is a schematic structural diagram of an inverter control device according to an embodiment of the present disclosure.

As shown in FIG. 8, the inverter control device 80 may be in the form of a general-purpose computing device, for example, a terminal device. Components of the inverter control device 80 may include, but are not limited to: at least one processor 81, at least one memory 82 storing instructions executable by the processor 81, and a bus 83 connecting different system components (including the memory 82 and the processor 81). The processor 81 is a processor of the smart device.

The processor 81 implements the following steps by running the executable instructions:

in a first switching period, determining a current change duration based on a time instant at which an inductor current in an inverter is equal to a first current threshold and a time instant at which the inductor current is equal to a second current threshold;

determining a current change rate based on the current change duration, the first current threshold, and the second current threshold;

reducing the first current threshold to obtain a third current threshold, and reducing the second current threshold to obtain a fourth current threshold, if the current change rate is greater than a preset threshold; and in a second switching period, controlling a switch in the inverter by using the third current threshold and the fourth current threshold, wherein the first current threshold is less than the second current threshold, and the first switching period is earlier than the second switching period.

In an embodiment, the processor 81 is further configured to, in the first switching period:

control a first switch corresponding to the first current threshold to be turned off when the inductor current is equal to the first current threshold; and control a second switch corresponding to the second current threshold to be turned off when the inductor current is equal to the second current threshold.

In an embodiment, the processor 81 is configured to, in the second switching period:

control the first switch corresponding to the first current threshold to be turned off when the inductor current is equal to the third current threshold; and control the second switch corresponding to the second current threshold to be turned off when the inductor current is equal to the fourth current threshold.

In an embodiment, the processor 81 is further configured to, after controlling the switch in the inverter by using the third current threshold and the fourth current threshold in the second switching period:

in a third switching period, increase the third current threshold to obtain a fifth current threshold, and increase the fourth current threshold to obtain a sixth current threshold, if the current change rate is less than or equal to the preset threshold; and in a fourth switching period, control the switch in the inverter using the fifth current threshold and the sixth current threshold, wherein the second switching period is earlier than the third switching period, the third switching period is earlier than the fourth switching period, and the fifth current threshold is less than the sixth current threshold.

In an embodiment, the processor 81 is configured to:

in the third switching period, increase the third current threshold after a preset time period to obtain the fifth current threshold, and increase the fourth current threshold after the preset time period to obtain the sixth current threshold, if the current change rate is less than or equal to the preset threshold.

In an embodiment, the processor 81 is further configured to, in the third switching period:

control a first switch corresponding to the first current threshold to be turned off when the inductor current is equal to the third current threshold; and control a second switch corresponding to the second current threshold to be turned off when the inductor current is equal to the fourth current threshold.

In an embodiment, the second current threshold is less than the inductor current of the inverter when the inverter is short-circuited.

Bus 83 represents one or more of several types of bus structures, including a memory bus or memory controller, a peripheral bus, a processor, or a local bus using any of a variety of bus structures.

The memory 82 may include readable media in the form of volatile memory, such as random access memory (RAM) 821 and/or cache memory 822, and may further include a read only memory (ROM) 823.

The memory 82 may further include a program/utility 825 having a set (at least one) of program modules 824 including, but not limited to, an operating system, one or more application programs, other program modules, and program data. Each or some combination of the examples may include the implementation of a network environment.

The inverter control device 80 may communicate with one or more external devices 84 (such as a keyboard, a pointing device, and the like), and may further communicate with one or more devices that enable a user to interact with the inverter control device 80, and/or communicate with any device (for example, a router, a modem, and the like) that enables the inverter control device 80 to communicate with one or more other computing devices. Such communication may occur through an input/output (I/O) interface 85. Moreover, the inverter control device 80 can also communicate with one or more networks (such as a local area network (LAN), a wide area network (WAN) and/or a public network such as the Internet) through a network adapter 86. As shown in FIG. 8, the network adapter 86 communicates with other modules of the inverter control device 80 via a bus 83. It should be appreciated that although not shown, other hardware and/or software modules may be used in conjunction with inverter control device 80, including but not limited to: microcode, a device driver, a redundant processing unit, an external disk drive array, a RAID system, a tape drive, and a data backup storage system.

It should be noted that the processor in the embodiments of the present disclosure include not only a CPU, an MCU, a DSP, and the like, but also a programmable logic device, such as a CPLD, a FPGA, and the like. For example, the CPU, MCU, DSP and other processors and programmable logic devices operates jointly to perform the above method, for example, the CPU, MCU, DSP and other processors are responsible for threshold adjustment and switch control, and programmable logic device is responsible for receiving the overcurrent signal from the peripheral circuit, and calculating and determining the current change rate. The programmable logic device may be arranged between processors such as CPUs, MCUs, DSPs, and peripherals.

It should be noted that the division of functions among the CPU, MCU, DSP and other processors and the programmable logic device is not limited to the above-mentioned division, and other divisions that can implement the method of the present disclosure are applicable to the embodiment of the present disclosure, or the programmable logic device may not be used, as long as the method according to the embodiments of the present disclosure can be implemented.

In some possible implementations, a computer storage medium is further provided according to the embodiments of the present disclosure, the computer-readable storage medium stores computer instructions, and the computer instructions, when run on a computer, cause the computer to execute steps of the inverter control method according to any one of the above embodiments.

In some possible implementations, various aspects of the present disclosure can also be implemented in the form of a program product, which includes program codes. When the program product runs on a terminal device, the program codes are configured to cause the terminal device to execute steps of various modules in the inverter control apparatus according to various exemplary embodiments of the present disclosure described in the "DETAILED DESCRIPTION OF EMBODIMENTS" section, for example, the terminal may be configured to: in a first switching period, determine a current change duration based on a time instant at which an inductor current in an inverter is equal to a first current threshold and a time instant at which the inductor current is equal to a second current threshold; determine a current change rate based on the current change duration, the first current threshold, and the second current threshold; reduce the first current threshold to obtain a third current threshold, and reduce the second current threshold to obtain a fourth current threshold, if the current change rate is greater than a preset threshold; and in a second switching period, control a switch in the inverter by using the third current threshold and the fourth current threshold, where the first current threshold is less than the second current threshold, and the first switching period is earlier than the second switching period.

A program product may take the form of any combination of one or more readable media. The readable medium may be a readable signal medium or a readable storage medium. A readable storage medium may be, for example, but not limited to, an electrical, magnetic, optical, electromagnetic, infrared, or semiconductor system, apparatus, or device, or any combination of the foregoing. More specific examples (an non-exhaustive list) of the readable storage medium include: an electrical connection with one or more wires, a portable disk, a hard disk, a random access memory (RAM), a read only memory (ROM), an erasable programmable read-only memory (EPROM or flash memory), an optical fiber, a portable compact disk read-only memory (CD-ROM), an optical storage device, a magnetic storage device, or any suitable combination of the foregoing.

Figure 9:
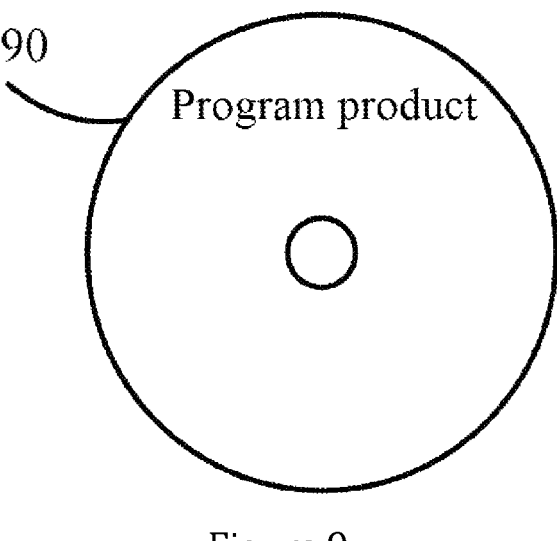
FIG. 9 is a schematic diagram of a program product for inverter control according to an embodiment of the present disclosure.

As shown in FIG. 9, a program product 90 for inverter control according to an embodiment of the present disclosure is illustrated, which can adopt a portable compact disk read-only memory (CD-ROM) and includes program codes, and can be installed on a terminal device, such as running on a personal computer. However, the program product of the present disclosure is not limited thereto. In this specification, a readable storage medium may be any tangible medium containing or storing a program, and the program may be used by or in combination with an instruction execution system, apparatus or device.

A readable signal medium may include a data signal carrying readable program codes included in in baseband or transmitted as part of a carrier wave. Such propagated data signal may take many forms, including but not limited to an electromagnetic signal, an optical signal, or any suitable combination of the foregoing. A readable signal medium may also be any readable medium other than a readable storage medium that can transmit, propagate, or transport a program for use by or in conjunction with an instruction execution system, apparatus, or device.

Program codes contained in a readable medium may be transmitted using any appropriate medium, including but not limited to wireless medium, wired medium, an optical fiber cable, RF, and the like, or any suitable combination of the foregoing.

The computer program codes for performing the operations according to the present disclosure may be written in at least one programming language or a combination of the at least one programming language. The programming language includes an object oriented programming language such as Java, Smalltalk, C++ and a conventional procedural programming language such as "C" programming language or a programming language similar to "C" programming language. The program codes may be completely executed on a user computer, partially executed on the user computer, executed as a standalone software package, partially executed on the user computer and partially executed on a remote computer, or completely executed on the remote computer or a server. In the cases relating to the remote computer, the remote computer may be connected to the user computer via any kind of networks including Local Area Network (LAN) or Wide Area Network (WAN), or the remote computer may be connected to an external computer (for example, via Internet provided by an Internet service provider).

It should be noted that although several modules or sub-modules of the system are mentioned in the above detailed description, this division is only exemplary and not mandatory. Actually, according to the embodiments of the present disclosure, the features and functions of two or more modules described above may be embodied in one module. Conversely, the features and functions of one module described above may be further divided to be embodied by multiple modules.

The present disclosure is described above with reference to block diagrams and/or flowcharts illustrating the method, the apparatus (system) and/or the computer program product according to embodiments of the present application. It will be understood that one block of the block diagrams and/or flowchart illustrations, and combinations of blocks in the block diagrams and/or flowchart illustrations, can be implemented by computer program instructions. These computer program instructions may be provided to a processor of a general purpose computer, a special purpose computer and/or other programmable data processing apparatus to produce a machine such that instructions executed via the computer processor and/or other programmable data processing apparatus create a means of implementing the functions/acts specified in the block diagrams and/or flowchart blocks.

Accordingly, the present disclosure may also be implemented in hardware and/or software (including firmware, resident software, microcode, and the like). Still further, the present disclosure may take the form of a computer program product on a computer-usable or computer-readable storage medium having computer-usable or computer-readable program codes embodied in the medium for use by an instruction execution system or in conjunction with the instruction execution system. In the context of the present disclosure, a computer-usable or computer-readable medium may be any medium that may contain, store, communicate, transmit, or convey a program for use by, or in connection with, an instruction execution system, apparatus, or device.

Obviously, those skilled in the art can make various changes and modifications to the present disclosure without departing from the spirit and scope of the present disclosure. Thus, if these modifications and variations of the present disclosure fall within the scope of the claims of the present disclosure and their equivalent technologies, the present disclosure also intends to include these modifications and variations.

The invention claimed is:

1. An inverter control method, characterized in comprising:

in a first switching period, determining a current change duration based on a time instant at which an inductor current in an inverter is equal to a first current threshold and a time instant at which the inductor current is equal to a second current threshold;

determining a current change rate based on the current change duration, the first current threshold, and the second current threshold;

reducing the first current threshold to obtain a third current threshold, and reducing the second current threshold to obtain a fourth current threshold, if the current change rate is greater than a preset threshold; and in a second switching period, controlling a switch in the inverter by using the third current threshold and the fourth current threshold, wherein the first current threshold is less than the second current threshold, and the first switching period is earlier than the second switching period.

2. The method according to claim 1, characterized in that the method further comprises, in the first switching period:

controlling a first switch corresponding to the first current threshold to be turned off when the inductor current is equal to the first current threshold; and controlling a second switch corresponding to the second current threshold to be turned off when the inductor current is equal to the second current threshold.

3. An inverter control device, characterized in comprising a memory and a processor, the memory stores a computer program, and the processor implements steps of the inverter control method according to claim 2 when executing the computer program.

4. A non-transitory computer storage medium storing computer instructions, characterized in that the computer instructions, when run on a computer, causes the computer to execute steps of the inverter control method according to claim 2.

5. The method according to claim 1, characterized in that in the second switching period, the controlling of the switch in the inverter by using the third current threshold and the fourth current threshold comprises:

controlling a first switch corresponding to the first current threshold to be turned off when the inductor current is equal to the third current threshold; and controlling a second switch corresponding to the second current threshold to be turned off when the inductor current is equal to the fourth current threshold.

6. An inverter control device, characterized in comprising a memory and a processor, the memory stores a computer program, and the processor implements steps of the inverter control method according to claim 5 when executing the computer program.

7. A non-transitory computer storage medium storing computer instructions, characterized in that the computer instructions, when run on a computer, causes the computer to execute steps of the inverter control method according to claim 5.

8. The method according to claim 1, characterized in that the method further comprises, after the controlling of the switch in the inverter by using the third current threshold and the fourth current threshold in the second switching period:

in a third switching period, increasing the third current threshold to obtain a fifth current threshold, and increasing the fourth current threshold to obtain a sixth current threshold, if the current change rate is less than or equal to the preset threshold; and in a fourth switching period, the controlling of the switch in the inverter by using the fifth current threshold and the sixth current threshold, wherein the second switching period is earlier than the third switching period, the third switching period is earlier than the fourth switching period, and the fifth current threshold is less than the sixth current threshold.

9. The method according to claim 8, characterized in that the increasing of the third current threshold to obtain the fifth current threshold and the increasing of the fourth current threshold to obtain the sixth current threshold in the third switching period if the current change rate is less than or equal to the preset threshold comprises:

in the third switching period, the increasing of the third current threshold after a preset time period to obtain the fifth current threshold, and the increasing of the fourth current threshold after the preset time period to obtain the sixth current threshold, if the current change rate is less than or equal to the preset threshold.

10. The method according to claim 8, characterized in that the method further comprises, in the third switching period:

controlling a first switch corresponding to the first current threshold to be turned off when the inductor current is equal to the third current threshold; and controlling a second switch corresponding to the second current threshold to be turned off when the inductor current is equal to the fourth current threshold.

11. The method according to claim 1, characterized in that the second current threshold is less than the inductor current of the inverter when the inverter is short-circuited.

12. An inverter control device, characterized in comprising a memory and a processor, the memory stores a computer program, and the processor implements steps of the inverter control method according to claim 1 when executing the computer program.

13. A non-transitory computer storage medium storing computer instructions, characterized in that the computer instructions, when run on a computer, causes the computer to execute steps of the inverter control method according to claim 1.

14. An inverter control apparatus, characterized in comprising:

a first determination module configured to, in a first switching period, determine a current change duration based on a time instant at which an inductor current in an inverter is equal to a first current threshold and a time instant at which the inductor current is equal to a second current threshold;

a second determination module configured to determine a current change rate based on the current change duration, the first current threshold, and the second current threshold;

an adjustment module configured to reduce the first current threshold to obtain a third current threshold, and reduce the second current threshold to obtain a fourth current threshold, if the current change rate is greater than a preset threshold;

a control module configured to, in a second switching period, control a switch in the inverter by using the third current threshold and the fourth current threshold, wherein the first current threshold is less than the second current threshold, and the first switching period is earlier than the second switching period.

15. The inverter control apparatus according to claim 14, characterized in that the control module is further configured to, in the first switching period:

control a first switch corresponding to the first current threshold to be turned off when the inductor current is equal to the first current threshold; and control a second switch corresponding to the second current threshold to be turned off when the inductor current is equal to the second current threshold.

16. The inverter control apparatus according to claim 14, characterized in that the control module is configured to, in the second switching period:

control a first switch corresponding to the first current threshold to be turned off when the inductor current is equal to the third current threshold; and control a second switch corresponding to the second current threshold to be turned off when the inductor current is equal to the fourth current threshold.

17. The inverter control apparatus according to claim 14, characterized in that the adjustment module is further configured to, after the controlling of the switch in the inverter by using the third current threshold and the fourth current threshold in the second switching period:

in a third switching period, increase the third current threshold to obtain a fifth current threshold, and increase the fourth current threshold to obtain a sixth current threshold, if the current change rate is less than or equal to the preset threshold; and in a fourth switching period, the controlling of the switch in the inverter using the fifth current threshold and the sixth current threshold, wherein the second switching period is earlier than the third switching period, the third switching period is earlier than the fourth switching period, and the fifth current threshold is less than the sixth current threshold.

18. The inverter control apparatus according to claim 17, characterized in that the adjustment module is configured to:

in the third switching period, the increasing of the third current threshold after a preset time period to obtain the fifth current threshold, and the increasing of the fourth current threshold after the preset time period to obtain the sixth current threshold, if the current change rate is less than or equal to the preset threshold.

19. The inverter control apparatus according to claim 17, characterized in that the control module is further configured to, in the third switching period:

control a first switch corresponding to the first current threshold to be turned off when the inductor current is equal to the third current threshold; and control a second switch corresponding to the second current threshold to be turned off when the inductor current is equal to the fourth current threshold.

20. The inverter control apparatus according to claim 14, characterized in that the second current threshold is less than the inductor current of the inverter when the inverter is short-circuited.

* * * * *